(12) United States Patent
Kang et al.

(10) Patent No.: US 7,892,704 B2
(45) Date of Patent: Feb. 22, 2011

(54) MASK FOR SILICON CRYSTALLIZATION, METHOD FOR CRYSTALLIZING SILICON USING THE SAME AND DISPLAY DEVICE

(75) Inventors: Myung Koo Kang, Seoul (KR); Soong Yong Joo, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 853 days.

(21) Appl. No.: 11/653,667

(22) Filed: Jan. 12, 2007

(65) Prior Publication Data
US 2007/0184638 A1    Aug. 9, 2007

(30) Foreign Application Priority Data
Jan. 12, 2006    (KR) .................. 10-2006-0003547

(51) Int. Cl.
*G01F 9/00* (2006.01)
*C30B 28/08* (2006.01)

(52) U.S. Cl. ............................. 430/5; 117/43
(58) Field of Classification Search ............ 430/5
See application file for complete search history.

(56) References Cited
U.S. PATENT DOCUMENTS

| | | | |
|---|---|---|---|
| 6,521,473 B1 * | 2/2003 | Jung | 438/30 |
| 6,706,545 B2 * | 3/2004 | Jung | 438/30 |
| 2004/0235277 A1 | 11/2004 | Crowder | |
| 2005/0173752 A1 * | 8/2005 | Chung et al. | 257/315 |
| 2006/0154154 A1 * | 7/2006 | Sun | 430/5 |

FOREIGN PATENT DOCUMENTS
WO    00/14784    3/2000

* cited by examiner

*Primary Examiner*—Mark F Huff
*Assistant Examiner*—Jonathan Jelsma
(74) *Attorney, Agent, or Firm*—Innovation Counsel LLP

(57) ABSTRACT

A mask for silicon crystallization capable of minimizing the number of grain boundaries in crystallized silicon, a method for crystallizing silicon using the mask, and a display device are presented. The mask includes a group of slits that are inclined at a predetermined angle with respect to a scan direction and a group of slits including slits inclined at a predetermined angle with respect to the former group of slits. The groups of slits are separated by an interval along the scan direction, and the substrate and/or mask is moved by the interval between irradiation by laser through the slits. Further, there are provided a method for crystallizing silicon using the mask and a display device. By reducing the number of grain boundaries that extend horizontally or vertically on the substrate, the invention obviates a design limitation associated with the directional anisotropy in sequential lateral solidification (SLS) technique.

13 Claims, 8 Drawing Sheets

MASK FOR SILICON CRYSTALLIZATION, METHOD FOR CRYSTALLIZING SILICON USING THE SAME AND DISPLAY DEVICE

CROSS-REFERENCE TO RELATED APPLICATION(S)

This patent application claims priority, under 35 USC 119, from Korean Patent Application No. 10-2006-0003547 filed on Jan. 12, 2006, the entire content of which is incorporated by reference herein.

BACKGROUND OF THE INVENTION

1. Field of the Invention

The present invention relates to a mask for silicon crystallization, a method for crystallizing silicon using the same and a display device. More particularly, the present invention relates to a mask for silicon crystallization, wherein the number of grain boundaries of crystallized silicon can be minimized, a method for crystallizing silicon using the mask and a display device.

2. Description of the Related Art

In a liquid crystal display (LCD), the amount of light transmitted through the liquid crystal (LC) panel is adjusted according to an image signal. The image signal is applied to a plurality of control switches arranged in a matrix, so that a desired image can be displayed on the LCD panel. An LCD is classified into an amorphous silicon thin film transistor (TFT) LCD and a polysilicon TFT LCD. A polysilicon TFT exhibits superior device characteristics to an amorphous silicon TFT, and a driving circuit can be mounted on a substrate of the polysilicon TFT. A crystallizing method for obtaining such a polysilicon thin film includes a variety of methods such as solid phase crystallization (SPC), rapid thermal annealing (RTA), excimer laser annealing (ELA) and sequential lateral solidification (SLS).

FIG. 1A is a schematic illustration of a sequential lateral solidification (hereinafter, referred to as "SLS") technique, and FIG. 1B is a schematic view of silicon crystallized by the SLS technique.

The SLS technique is a technique for crystallizing amorphous silicon after locally melting the amorphous silicon by using a slit formed in a mask. As compared with the existing ELA technique, the SLS technique has several advantages. For example, a variety of particle sizes (a few μm to a single crystal) can be achieved as desired, process margin is increased, and productivity is greatly enhanced because there is no limitation for the substrate size and no vacuum is required. Accordingly, much attention to the SLS technique has been paid as the next-generation crystallization technique. As shown in FIG. 1A, a laser beam passes through a slit 15 formed in a mask 10, melting the amorphous silicon locally. The slit is about a few μm long. A melted region 25 of a substrate 20 crystallizes as it is cooled, such that the crystals grow from the boundary between the melted region 25 and a neighboring unmelted region 27. The crystals grow toward the center of the melted region 25 and stops growing when particles meet one another at the center. The aforementioned process is repeated while moving the slit 15 little by little over the substrate 20, eventually crystallizing the entire substrate 20.

FIG. 1B shows a state where amorphous silicon has been crystallized using a straight slit. In this figure, the arrows designate crystal growth directions. When using such an SLS technique, the shape and size of a particle formed can be changed depending on the shape of the slit.

FIG. 2 schematically illustrates the process of a general single scan two-shot SLS. Referring to FIG. 2, when a shot of laser beam (first shot) is directed onto an amorphous silicon thin film using a mask with a plurality of slits, melted portions 25a and 25b are formed. The melted portions crystallize as they cool. The entire substrate can be crystallized by repeating the process of irradiating portions of the substrate with a laser beam (by using a second shot, third shot , . . . , and n-th shot) while moving a mask over the substrate between the shots.

FIGS. 3A and 3B are graphs showing the characteristics of a TFT that uses the silicon crystallized by the SLS process of FIG. 2. FIG. 3A is a graph plotting the characteristics of a TFT with a TFT channel formed in a horizontal direction, i.e. a crystal growth direction, and FIG. 3B is a graph plotting the characteristic of a TFT with a TFT channel formed in a vertical direction. A particle size nearly corresponding to the slit size is obtained in the horizontal direction (crystal growth direction), while a small particle size corresponding to about a few thousands angstroms (Å) is obtained in the vertical direction.

Referring to FIGS. 3A and 3B, the characteristics of a TFT, e.g. $I_{on}$ (for Vds=10.1 and Vgs=20) and electron mobility (for Vds=10.1), are shown in the following Table 1.

TABLE 1

| Direction | Characteristics | |
|---|---|---|
| | $I_{on}$ (μA) | Electron Mobility (cm$^2$/Vs) |
| Horizontal Direction | 750~900 | 100~120 |
| Vertical Direction | 200~330 | ~30 |

As illustrated in Table 1, the $I_{on}$ (μA) and electron mobility (cm$^2$/Vs) in a horizontal direction are about 750 to 900 and about 100 to 120, respectively. Further, the $I_{on}$ (μA) and electron mobility (cm$^2$/Vs) in a vertical direction are about 200 to 330 and up to about 30, respectively. That is, it can be understood that the horizontal characteristics are markedly better than the vertical characteristics. Due to such directional anisotropy, a TFT channel should be designed in only one direction when a circuit for a system-on-glass (SOG) product is built in a panel. This is an undesirable limitation. An SLS technique in which a two-shot SLS process is performed twice, once in a horizontal direction and another time in a vertical direction, has been conceived to overcome the limitation. According to the SLS technique, at least theoretically, the growth can be achieved in both horizontal and vertical directions. That is, a uniform microstructure with no anisotropic property in the horizontal and vertical directions can be obtained after the crystallization, and thus, the uniform characteristics can also be obtained.

FIGS. 4A and 4B are a view and photograph showing a microstructure of silicone crystallized using only a horizontal silt, respectively; FIGS. 4C and 4D are a view and photograph showing a microstructure of silicone crystallized using both horizontal and vertical silts, respectively.

Referring to FIGS. 4A to 4D, if a mask including both horizontal and vertical slits is used, a particle grown through one slit becomes a seed and grows perpendicularly to the direction of a particle grown through the next slit. However, if the vertical slit does not precisely align with one row of particles between horizontal grain boundaries but simultaneously aligns with parts of two rows of particles as shown in FIGS. 4A and 4C, the problem of anisotropic property in the particle is not completely solved since a sub grain boundary forms perpendicularly to the original grain boundary, as indicated by the circles in FIG. 4C. Since an actual grain boundary is almost never a perfectly straight line, such a phenomenon occurs frequently. Accordingly, the existing 2+2 shot SLS process is not a great improvement relative to the two-shot SLS process, at least from the perspective of limitations imposed by the anisotropic property.

SUMMARY OF THE INVENTION

In one aspect, the present invention provides a mask for silicon crystallization in which design constraints associated with anisotropic properties in both horizontal and vertical directions are overcome. The mask has a first, a second, third, and a fourth group of slits that are spaced apart from one another in the scan direction. In each group of slits, the slits are spaced apart from one another in a direction perpendicular to a scan direction. The first and second groups of slits are inclined to form an obtuse angle with respect to the scan direction. The third and fourth groups of slits are inclined to form an acute angle with respect to the scan direction.

In another aspect, the invention is a mask for silicon crystallization that includes a first group of slits that form a first predetermined angle with respect to a scan direction and a second group of slits that form a predetermined angle with respect to the first group of slits.

In yet another aspect, the invention is a method for crystallizing silicon using the above-described mask for silicon crystallization. The method may entail forming a silicon thin film on a substrate, placing a mask over the substrate such that slits in the mask form an angle between about 5 degrees and about 85 degrees with respect to an edge of the substrate, positioning the slits over a preselected region of the substrate, irradiating the preselected region through the slits to melt the silicon in the preselected region; and allowing the preselected region to cool.

In yet another aspect, the present invention is a display device that includes a polysilicon thin film of which grain and sub-grain boundaries are inclined at an angle between about 5 and about 85 degrees with respect to the edges of a substrate.

BRIEF DESCRIPTION OF THE DRAWINGS

The above and other objects, features and advantages of the present invention will become apparent from the following description of a preferred embodiment given in conjunction with the accompanying drawings, in which.

DETAILED DESCRIPTION OF THE INVENTION

Hereinafter, a preferred embodiment of the present invention will be described in detail with reference to the accompanying drawings. As used herein, the terms "horizontal" and "vertical" are used in reference to the drawings.

Figure 1A:
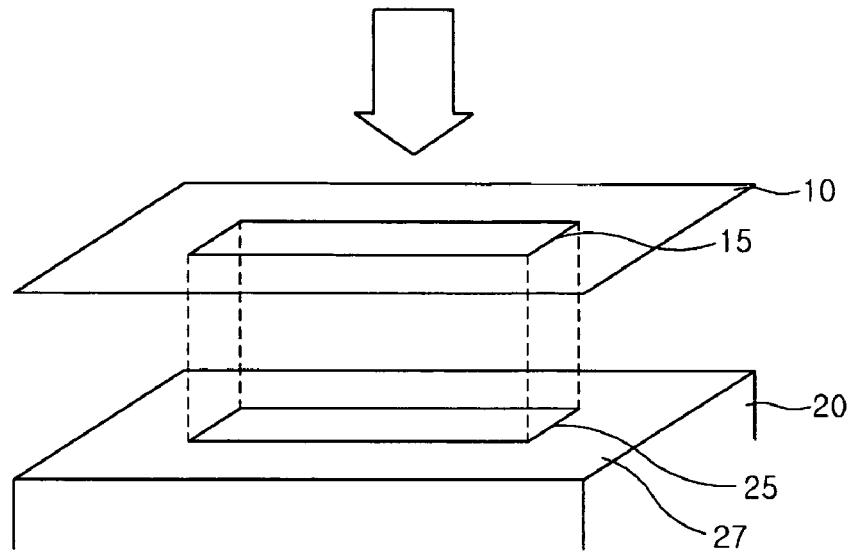
FIG. 1A is a view schematically showing a basic principle of a sequential lateral solidification (SLS) technique among general crystallization techniques.
Figure 1B:
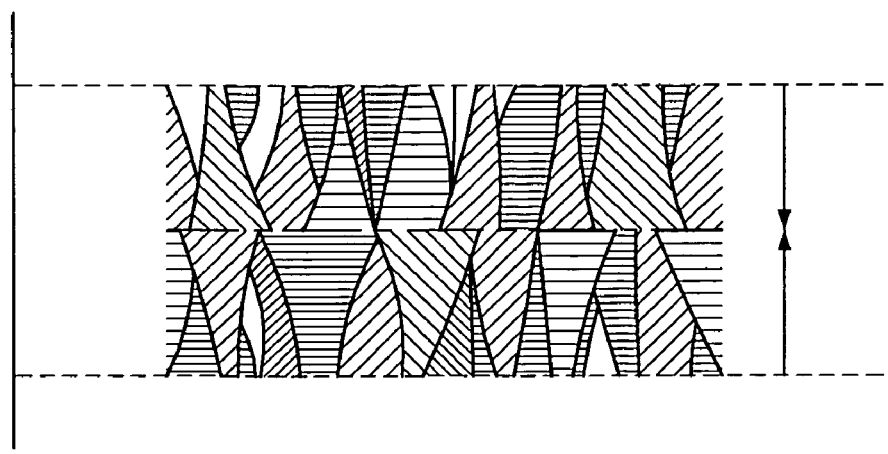
FIG. 1B is a schematic view of silicon crystallized by the SLS technique.
Figure 2:
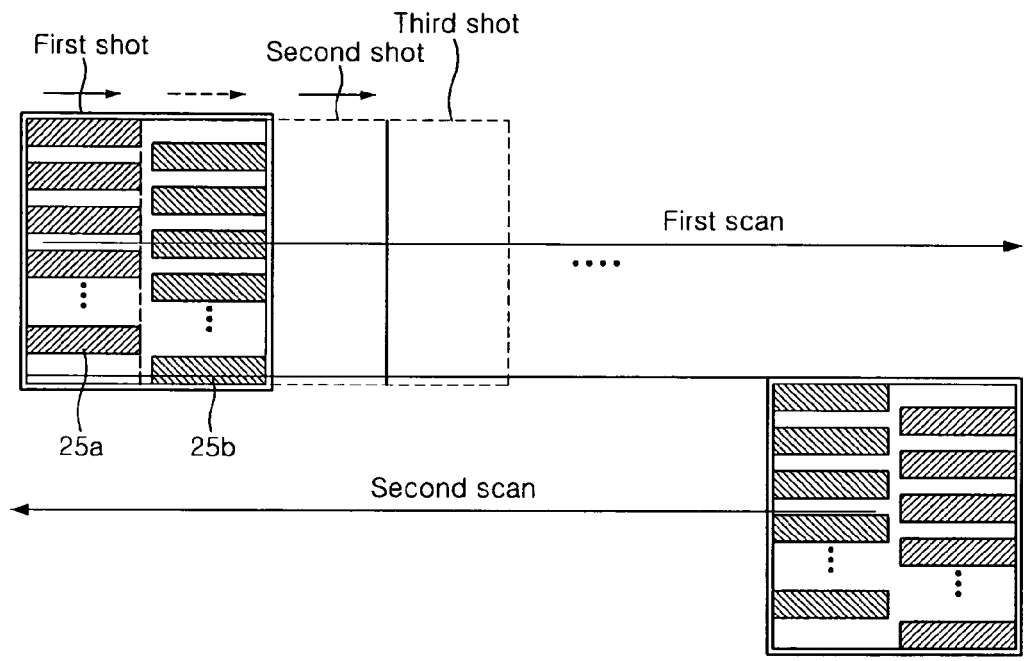
FIG. 2 schematically illustrates a sequential progress for a general single scan two-shot SLS.
Figure 3A:
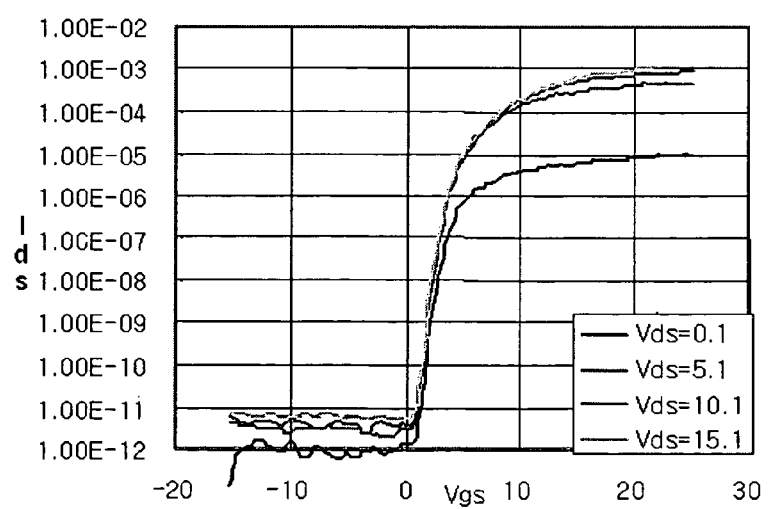
FIGS. 3A and 3B are graphs showing the characteristics of a thin film transistor (TFT) using silicon crystallized by the SLS process of FIG. 2.
Figure 3B:
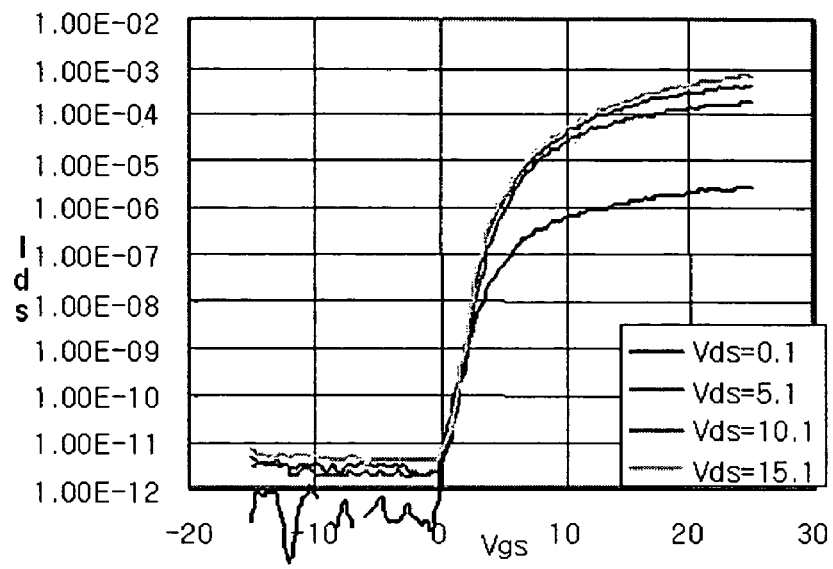
Figure 4A:
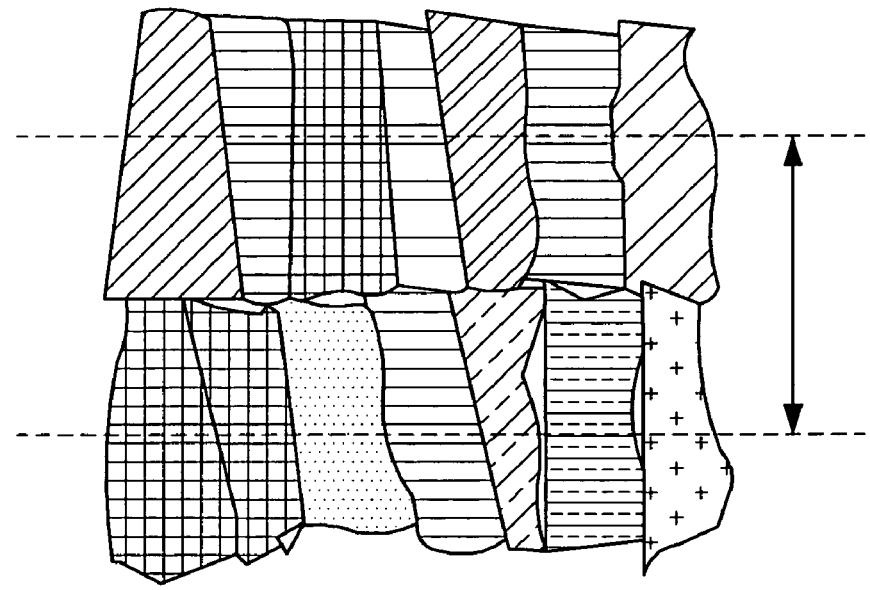
FIGS. 4A and 4B are a view and photograph showing a microstructure of silicone crystallized using only a horizontal silt, respectively.
Figure 4B:
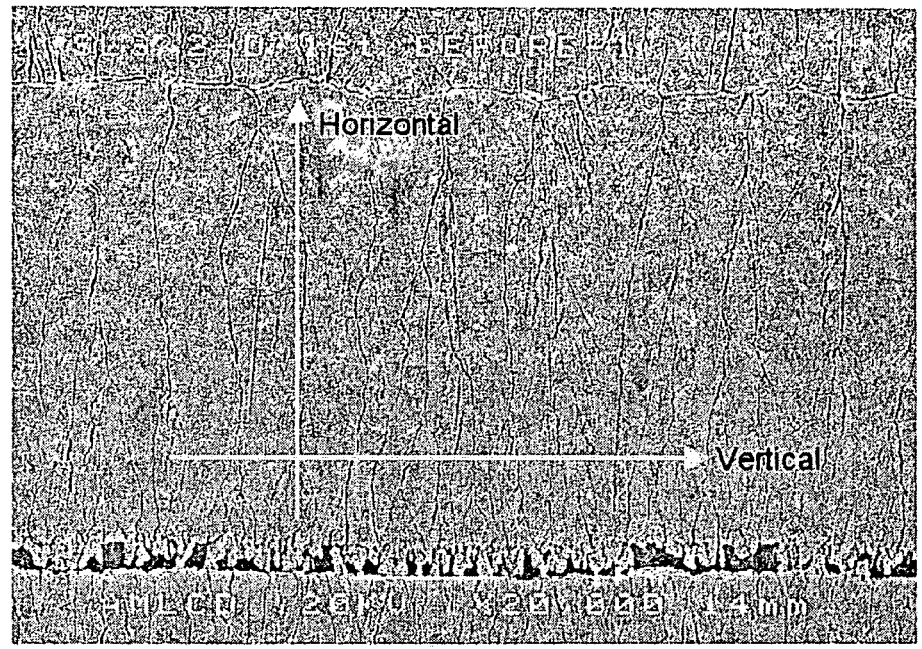
Figure 4C:
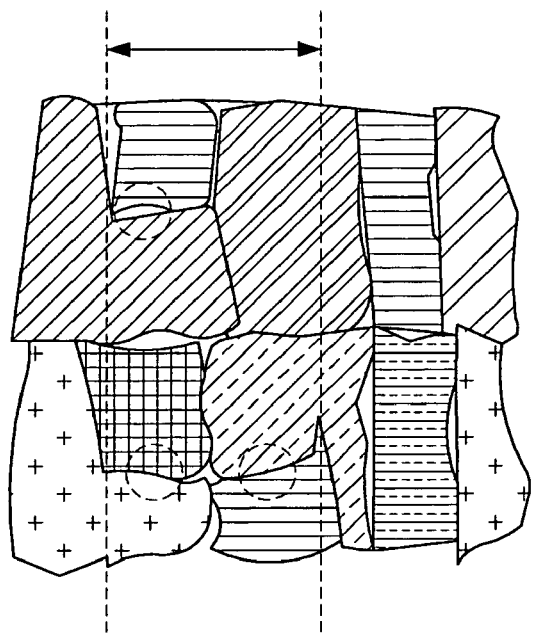
FIGS. 4C and 4D are a view and photograph showing a microstructure of silicone crystallized using both horizontal and vertical silts, respectively.
Figure 4D:
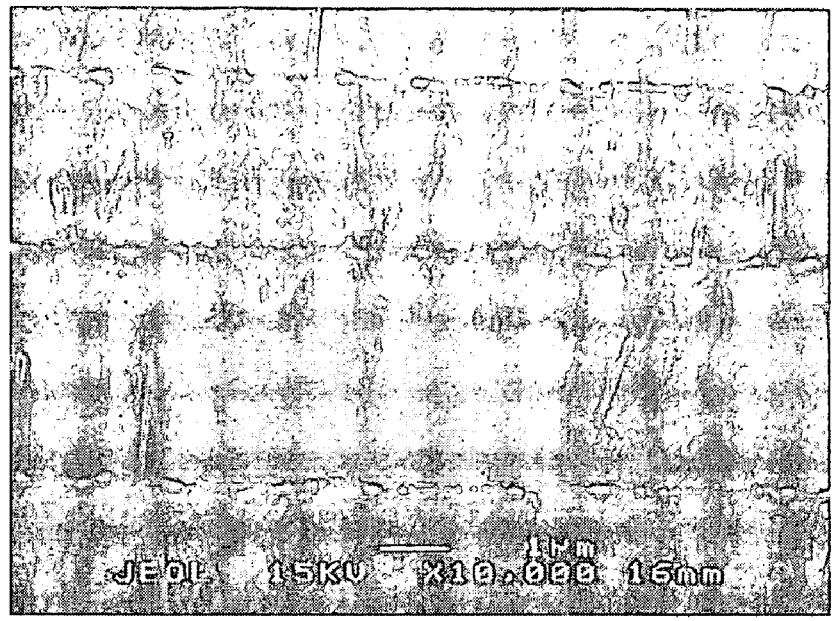
Figure 5:
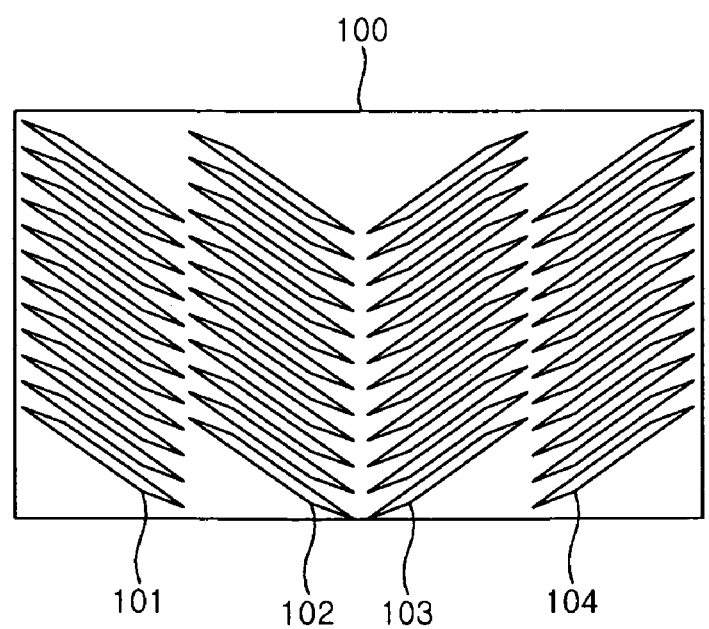
FIG. 5 is a view showing a mask for silicon crystallization according to the present invention.

FIG. 5 shows a mask for silicon crystallization according to the present invention.

More specifically, FIG. 5 shows a mask 100 formed with a first group of slits 101, a second group of slits 102, a third group of slits 103 and a fourth group of slits 104.

The mask 100 includes the first, second, third and fourth groups of slits 101, 102, 103 and 104, each of which is formed inclined at a predetermined angle with respect to a scan direction, such that a laser beam can be selectively transmitted through the mask 100. As used herein, "scan direction" is the direction in which the mask 100 is moved over the substrate. Each of the first to fourth groups of slits 101 to 104 includes a plurality of slits. Although the mask 100 includes only one row of slits in each group for this particular embodiment, the present invention is not limited thereto. That is, there may be multiple rows of slits in each group arranged on the mask 100.

The first group of slits 101 includes a plurality of slits, each of which is inclined at an obtuse angle with respect to the scan direction. The plurality of slits are arranged to be spaced apart from each other by a predetermined interval in a direction perpendicular to the scan direction. Each slit is about 4 to 6 μm wide but the width may be adjusted as desired. In this embodiment, the first group of slits 101 is formed to be inclined at about 135 degrees with respect to the scan direction.

The second group of slits 102 includes a plurality of slits, each of which is inclined at an obtuse angle with respect to the scan direction. The plurality of slits are arranged to be spaced apart from each other by a predetermined interval in a direction perpendicular to the scan direction. Each slit is about 4 to 6 μm wide but the width may be adjusted as desired. In this embodiment, the second group of slits 102 is formed to be inclined at about 135 degrees with respect to the scan direction. The slits in the second group of slits 102 are arranged to be substantially parallel with those of the first group of slits 101. If the first group of slits 101 and the second group of slits 102 are arranged close to each other, they are arranged in a staggered manner such that the two groups of slits do not overlap each other or connect to form long slits.

The third group of slits 103 comprises a plurality of slits, each of which is inclined at an acute angle with respect to the scan direction. The plurality of slits are arranged to be spaced apart from each other by a predetermined interval in a direction perpendicular to the scan direction. In this embodiment, the third group of slits 103 is formed to be inclined at about 45 degrees with respect to the scan direction. Each slit is about 4 to 6 μm wide but the width may be adjusted as desired.

The fourth group of slits 104 comprises a plurality of slits, each of which is inclined at an acute angle with respect to the scan direction. The plurality of slits are arranged to be spaced apart from each other by a predetermined interval in a direction perpendicular to the scan direction. In this embodiment, the fourth group of slits 104 is formed to be inclined at about 45 degrees with respect to the scan direction. Each slit is about 4 to 6 μm wide but the width may be adjusted as desired.

The slits of the fourth group of slits 104 are arranged to be parallel with those of the third group of slits 103. If the third group of slits 103 and the fourth group of slits 104 are arranged close to each other, they are arranged in a staggered manner such that the two groups of slits do not overlap each other or connect to form long slits.

The first to fourth groups of slits 101 to 104 are arranged to be adjacent to one another as described above in the embodiment shown in FIG. 5, but the present invention is not limited to the embodiment shown. For example, the specific arrangement of the groups of slits may be changed. In some embodiments, the third or fourth group of slits 103 or 104 may be arranged between the first group of slits 101 and the second group of slits 102.

Figure 6:
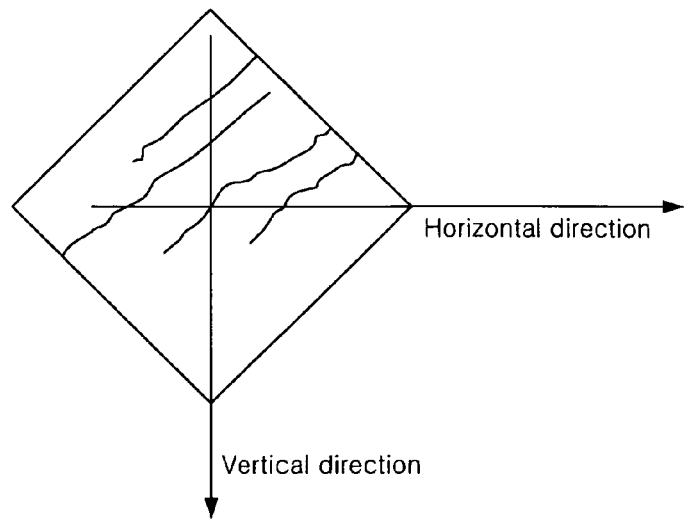
FIG. 6 is a view schematically showing the shape of a silicon particle crystallized using the mask for silicon crystallization according to the present invention.

FIG. 6 is a view schematically showing the shape of a silicon particle crystallized using the mask for silicon crystallization according to the present invention.

Referring to FIG. 6, if the aforementioned mask 100 is aligned on an amorphous silicon thin film formed on a substrate and irradiated with a laser beam, silicon in a select region on the substrate is crystallized by the first group of slits 101 in a direction inclined at a predetermined angle, e.g. 95 to 175 degrees, and preferably 135 degrees, with respect to the scan direction on the substrate. The other uncrystallized portions are crystallized by the second group of slits 102, which is parallel to and staggered with the first group of slits 101, so that the predetermined region on the substrate has silicon particles crystallized and grown in a direction inclined at 135 degrees with respect to the scan direction on the substrate.

Further, if a laser beam is directed onto the region crystallized by the first and second groups of slits 101 and 102 through the third and fourth groups of slits 103 and 104 arranged in a direction perpendicular to the first and second groups of slits 101 and 102, the crystal is again grown in a direction perpendicular to a crystal growth direction obtained by the first and second groups of slits 101 and 102. As shown in FIG. 6, a silicon particle is consequently crystallized and grown in the shape of a rectangle or square, i.e. rhombus, arranged to be rotated by a predetermined angle, e.g. 5 to 85 degrees, and is preferably 45 degrees, with respect to a horizontal or vertical edge of the substrate. Since a silicon particle crystallized and grown in the manner described above form a crystalline region that is inclined at about 45 degrees, even though a grain boundary exists, there is hardly a difference between the vertical and horizontal characteristics.

Figure 7:
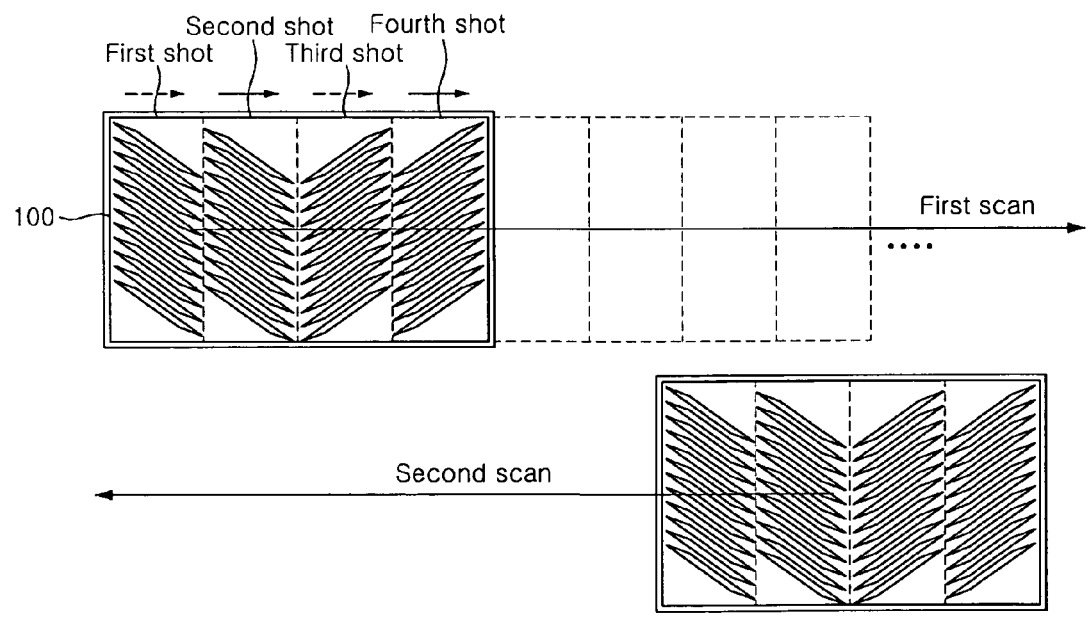
FIG. 7 schematically shows a sequential SLS process using the mask for silicon crystallization according to the present invention.

FIG. 7 schematically shows a sequential SLS process using the mask for silicon crystallization according to the present invention.

Referring to FIG. 7, a substrate with a silicon thin film formed thereon is first prepared.

Next, the mask 100 as described above and shown in FIG. 5 is positioned above the substrate such that the location of the mask 100 is aligned with the target zone on the substrate.

Then, the substrate on which the mask 100 is arranged is irradiated with a laser beam. That is, a shot of laser beam (first shot) is shone onto the amorphous silicon thin film through the first to fourth groups of slits 101 to 104 of the mask 100 simultaneously. If the laser beam is irradiated in such a manner, regions on the amorphous silicon thin film corresponding to the locations of the first to fourth groups of slits 101 to 104 are melted and then crystallized as they are cooled.

The process of irradiating a laser beam is repeated (second shot, third shot , . . . , or n-th shot) while moving a stage mounted with the substrate by one group of slits (alternatively, the mask may be moved while the substrate stays still or both the mask and the substrate may be moved). For example, the region that was covered by the fourth group of slits during the first shot will be covered by the third group of slits during the second shot, the second group of slits during the third shot, etc. This moving of the substrate and/or the mask is repeated until the entire regions of the amorphous silicon thin film formed on the substrate are crystallized in such a manner that a first scan is performed from one end to the opposite end of the substrate. Then, the stage is moved to a neighboring region, e.g. a region beneath the first scan, and a second scan is performed in a direction opposite to that of the first scan. If the SLS process is performed in the manner described above, the laser beam is irradiated four times in a state where the first to fourth groups of slits 101 to 104 are sequentially arranged in a predetermined region on the amorphous silicon thin film formed on the substrate, so that the crystallization of the silicon on the predetermined region is completed.

In some embodiments, the SLS process may be performed using a mask including a group of slits formed in a horizontal direction and group of slits formed in a vertical direction rather than the mask 100 shown in FIG. 5. In this case, a substrate with an amorphous silicon thin film formed thereon is first prepared. Next, the mask is aligned, and a stage mounted with the substrate is positioned to be inclined at a predetermined angle with respect to the mask.

Then, the substrate on which the mask is arranged is irradiated with a laser beam. That is, the laser beam is directed onto the amorphous silicon thin film through groups of slits in the mask. If the laser beam is irradiated in such a manner, regions of the amorphous silicon thin film corresponding to the locations of the slits are melted and then crystallized as they are cooled. If the SLS process is performed in the manner described above, a silicon particle is crystallized and grown in the shape of a rectangle (e.g., a square, a rhombus), arranged to be inclined by a predetermined angle (e.g. 5 to 85 degrees, and preferably 45 degrees) with respect to the horizontal or vertical direction of the substrate as shown in FIG. 6.

FIGS. 8A to 8D are graphs, respectively, plotting the characteristics of TFTs in which channels are formed in horizontal and vertical directions of a substrate with a crystallized silicon thin film formed therein according to the SLS process of the present invention. In the case of FIGS. 8A to 8D, the measured substrate was a 2-inch low-temperature polysilicon TFT and the thickness of the crystallized polysilicon thin film was about 800 Å.

Figure 8A:
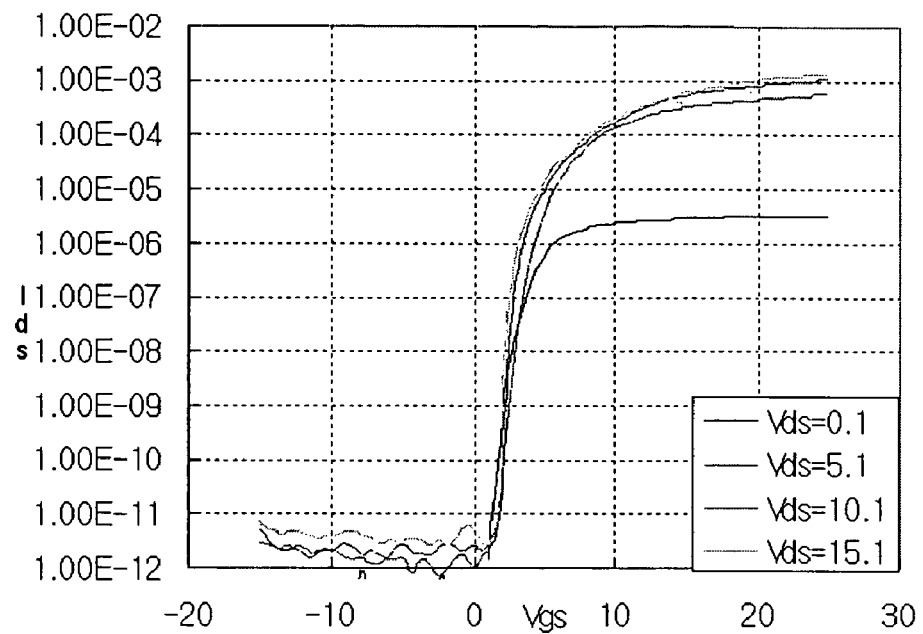
FIGS. 8A to 8D are graphs, respectively, plotting characteristics of TFTs in which channels are formed in horizontal and vertical directions of a substrate with a crystallized silicon thin film formed therein according to an SLS process of the present invention.
Figure 8B:
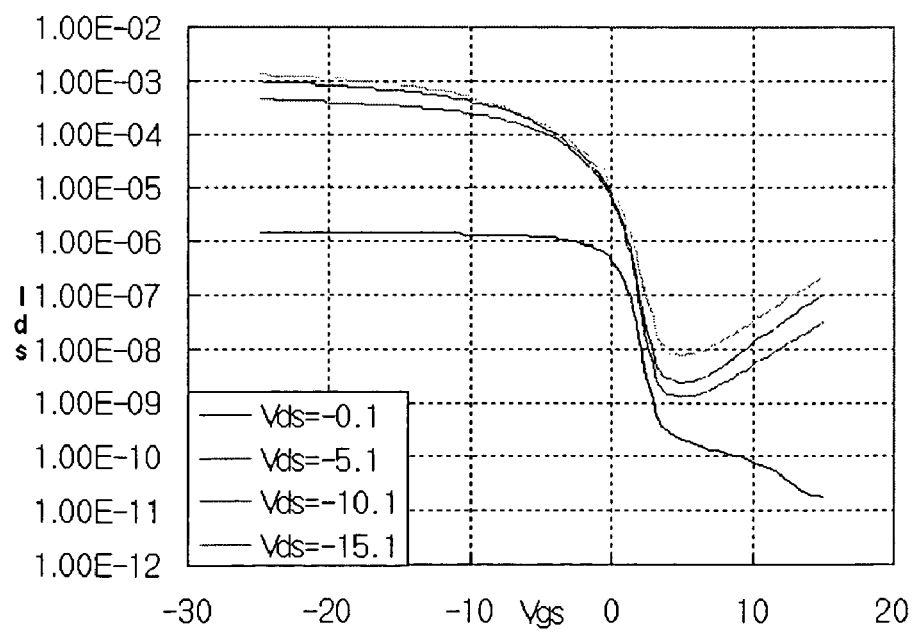
Figure 8C:
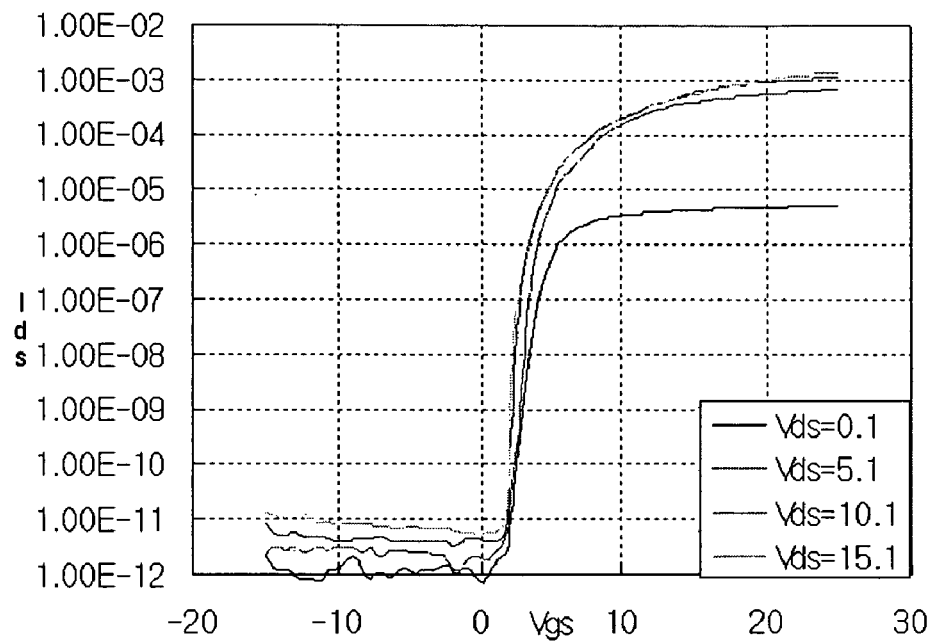
Figure 8D:
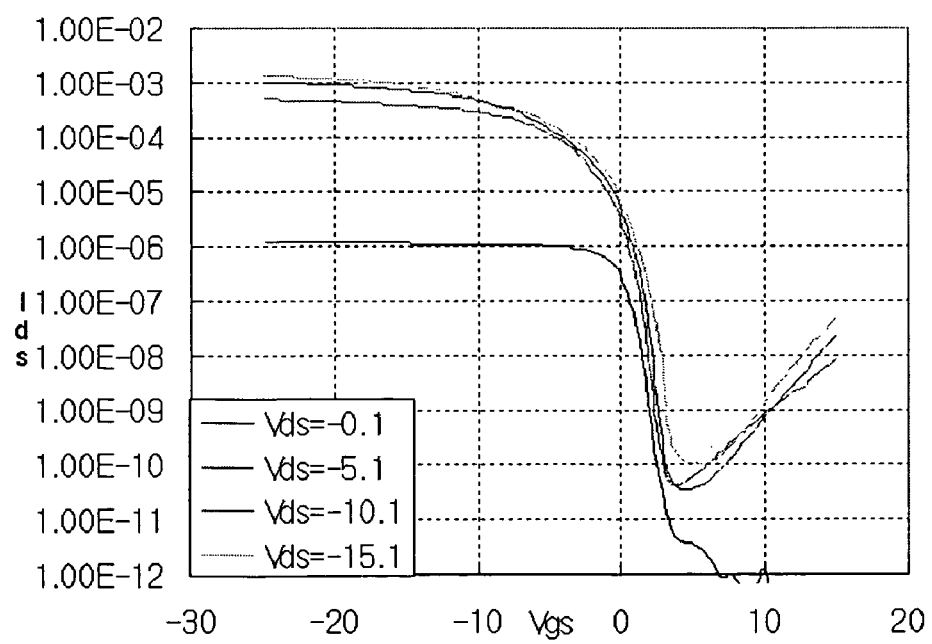

FIGS. 8A and 8B are graphs plotting the characteristics of N-TFT and P-TFT in which the channels are formed in a horizontal direction of the substrate with the crystallized silicon thin film formed therein by means of the SLS process according to the present invention, respectively; and FIGS. 8C and 8D are graphs plotting the characteristics of N-TFT and P-TFT in which the channels are formed in a vertical direction of the substrate with the crystallized silicon thin film formed therein by means of the SLS process according to the present invention.

Referring to FIGS. 8A to 8D, the characteristics of each of the TFTs, e.g. $I_{on}$ (for Vds=10.1 and Vgs=20) and electron mobility (for Vds=10.1) are shown in the following Table 2.

TABLE 2

| | N-TFT | | | | P-TFT | | | |
|---|---|---|---|---|---|---|---|---|
| | $I_{on}$ (µA) | | Electron Mobility (cm$^2$/Vs) | | $I_{on}$ (µA) | | Electron Mobility (cm$^2$/Vs) | |
| Direction | 1$^{st}$ | 2nd | 1st | 2nd | 1$^{st}$ | 2nd | 1st | 2nd |
| Horizontal | 750 | 923 | 84.27 | 105.74 | 918 | 914 | 87.02 | 84.23 |
| Vertical | 727 | 749 | 84.64 | 101.56 | 756 | 750 | 61.42 | 61.46 |

The $I_{on}$ (µA) and electron mobility (cm$^2$/Vs) of the horizontal N-TFT are about 750 to 923 and about 84 to 106, respectively; and the $I_{on}$ (µA) and electron mobility (cm$^2$/Vs) of the horizontal P-TFT are about 914 to 918 and about 84 to 87, respectively.

Further, the $I_{on}$ (µA) and electron mobility (cm$^2$/Vs) of the vertical N-TFT are about 727 to 749 and about 85 to 102, respectively; and the $I_{on}$ (µA) and electron mobility (cm$^2$/Ns) of the vertical P-TFT are about 750 to 756 and about 61, respectively.

With the invention, the number of grain boundaries that extend in the horizontal and vertical directions of the substrate can be minimized, and thus, a difference between the horizontal and vertical characteristics becomes substantially nonexistent. As a result, it is not necessary to consider the directivity of channels when designing TFTs since the limitation associated with the directional anisotropic property of particles has been eliminated. Effectively, a design constraint has been eliminated.

As described above, according to the present invention, the number of grain boundaries in the horizontal and vertical directions of the substrate can be minimized, and there is hardly a difference between the vertical and horizontal characteristics since a crystallized particle is inclined at about 45 degrees even though a grain boundary exists. As a result, the limitation associated with the directional anisotropic property in conventional devices is solved and TFTs can be designed without limitation to the direction of TFT channels when a circuit for an SOG product is built in a panel.

Although the present invention has been described in detail in connection with the specific embodiment of a mask for silicon crystallization, a method for crystallizing silicon using the same and a display device according to the present invention, it will be readily understood by those skilled in the art that various modifications and changes can be made thereto within the technical spirit and scope of the present invention. It is also apparent that the modifications and changes fall within the scope of the present invention defined by the appended claims.

What is claimed is:

1. A mask for silicon crystallization, comprising:
a first group of slits including one or more slits inclined at an obtuse angle with respect to a scan direction, wherein the slits are spaced apart from one another in a direction perpendicular to the scan direction;
a second group of slits including one or more slits inclined at an obtuse angle with respect to the scan direction, wherein the slits are spaced apart from one another in a direction perpendicular to the scan direction;
a third group of slits including one or more slits inclined at an acute angle with respect to the scan direction, wherein the slits are arranged spaced apart from one another in a direction perpendicular to the scan direction; and
a fourth group of slits including one or more slits inclined at an acute angle with respect to the scan direction, wherein the slits are spaced apart from one another in a direction perpendicular to the scan direction,
wherein the first, second, third and fourth groups of slits are spaced apart from one another in the scan direction, the scan direction being substantially the same as a direction in which the groups of slits are arranged.

2. The mask as claimed in claim 1, wherein the first group of slits and the second group of slits are arranged in a staggered manner with respect to each other, and the third group of slits and the fourth group of slits are arranged in a staggered manner with respect to each other.

3. The mask as claimed in claim 1, wherein the slits of the first and the second groups of slits are inclined at an angle that is substantially identical with respect to the scan direction, and the slits of the third and the fourth groups of slits are inclined at an angle that is substantially identical with respect to the scan direction.

4. The mask as claimed in claim 3, wherein the first and the third groups of slits are inclined at an angle that is between about 10 and about 170 degrees with respect to the scan direction.

5. The mask as claimed in claim 1, wherein the slits of the first and the second groups of slits are inclined to form a substantially 135-degree angle with respect to the scan direction, and the slits of the third and the fourth groups of slits are inclined to form a substantially 45-degree angle with respect to the scan direction.

6. The mask as claimed in claim 1, wherein the scan direction is parallel to an edge of the mask.

7. A mask for silicon crystallization, comprising:
a first group of slits that form a first angle with respect to a scan direction; and
a second group of slits that are non-parallel to the first group of slits,
wherein the first group of slits and the second group of slits are symmetrical with respect to a reference line that is perpendicular to the scan direction.

8. The mask as claimed in claim 7, wherein the second group of slits form a second angle with respect to the scan direction, further comprising:
a third group of slits arranged substantially parallel to the first group of slits; and
a fourth group of slits arranged substantially parallel to the second group of slits.

9. The mask as claimed in claim 8, wherein the first, second, third and fourth groups of slits are spaced apart from one another in the scan direction.

10. The mask as claimed in claim 7, wherein the scan direction is parallel to an edge of the mask.

11. The mask as claimed in claim 7, wherein the scan direction is substantially the same as a direction in which the first and second groups of slits are arranged.

12. A mask for silicon crystallization, comprising:
a first group of slits that form an obtuse angle with respect to a scan direction; and
a second group of slits that form a second predetermined angle with respect to the first groups of slits,
wherein the second group of slits are neither perpendicular nor parallel to the scan direction wherein the first group of slits and the second group of slits are symmetrical with respect to a reference line that is perpendicular to the scan direction.

13. The mask as claimed in claim 12, wherein the scan direction is parallel to an edge of the mask.

* * * * *